United States Patent
Lee

(10) Patent No.: US 10,552,277 B2
(45) Date of Patent: Feb. 4, 2020

(54) ELECTRONIC DEVICES

(71) Applicant: SK hynix Inc., Icheon-si, Gyeonggi-do (KR)

(72) Inventor: Jae In Lee, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 125 days.

(21) Appl. No.: 15/947,438

(22) Filed: Apr. 6, 2018

(65) Prior Publication Data

US 2019/0115937 A1    Apr. 18, 2019

(30) Foreign Application Priority Data

Oct. 17, 2017 (KR) .................. 10-2017-0134860

(51) Int. Cl.
  *G06F 11/22* (2006.01)
  *H03M 13/19* (2006.01)
  *G06F 11/07* (2006.01)
  *G06F 11/10* (2006.01)

(52) U.S. Cl.
  CPC ........ *G06F 11/2215* (2013.01); *G06F 11/073* (2013.01); *G06F 11/079* (2013.01); *G06F 11/1008* (2013.01); *H03M 13/19* (2013.01)

(58) Field of Classification Search
  CPC .................................. G06F 11/2215
  See application file for complete search history.

(56) References Cited

U.S. PATENT DOCUMENTS

| | | | | | |
|---|---|---|---|---|---|
| 4,149,038 | A | * | 4/1979 | Pitroda | H04Q 11/0407 370/244 |
| 4,794,597 | A | * | 12/1988 | Ooba | G11C 29/44 365/201 |
| 5,502,732 | A | * | 3/1996 | Arroyo | G06F 11/2215 714/703 |
| 6,799,287 | B1 | * | 9/2004 | Sharma | H03M 13/47 714/703 |
| 6,983,414 | B1 | * | 1/2006 | Duschatko | H03M 13/015 714/776 |

FOREIGN PATENT DOCUMENTS

KR    1020160145503 A    12/2016

* cited by examiner

*Primary Examiner* — Steve N Nguyen
(74) *Attorney, Agent, or Firm* — William Park & Associates Ltd.

(57) ABSTRACT

An electronic device may include a data conversion circuit, a parity conversion circuit and a verification signal generation circuit. The data conversion circuit may be configured to convert the data to generate internal data. The parity conversion circuit may be configured to convert a parity to generate an internal parity. The verification signal generation circuit may be configured to generate a verification signal from a syndrome signal and the error insertion code. The syndrome signal may be generated from the internal data and the internal parity.

24 Claims, 11 Drawing Sheets

FIG.2

| 1 | 0 | 0 | 1 | 1 | 0 | 1 |
|---|---|---|---|---|---|---|
| 0 | 1 | 0 | 1 | 0 | 1 | 1 |
| 0 | 0 | 1 | 0 | 1 | 1 | 1 |

1st MATRIX — 2nd MATRIX

FIG.5

|   | EI<3> | EI<2> | EI<1> |
|---|---|---|---|
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |
| 6 | 1 | 1 | 0 |
| 7 | 1 | 1 | 1 |

ELECTRONIC DEVICES

CROSS-REFERENCE TO RELATED APPLICATIONS

The present application claims priority under 35 U.S.C 119(a) to Korean Application No. 10-2017-0134860, filed on Oct. 17, 2017, which is incorporated herein by reference in its entirety.

BACKGROUND

1. Technical Field

Embodiments of the present disclosure generally relate to electronic devices, and more particularly to electronic devices relating to errors.

2. Related Art

Recently, a DDR2 scheme or a DDR3 scheme receiving and outputting four-bit data or eight-bit data during each clock cycle time has been used to improve the operation speeds of semiconductor devices. If a data transmission speed of the semiconductor devices increases, then the probability of errors occurring may increase as well when data is transmitted with the semiconductor devices. Accordingly, novel design schemes have been proposed to improve the reliability of the data transmissions.

Whenever data is transmitted in semiconductor devices, error codes which are capable of detecting the occurrence of errors may be generated and transmitted with the data to guarantee the reliability of data transmission. The error codes may include an error detection code (EDC) which is capable of detecting errors and an error correction code (ECC) which is capable of correcting the errors by itself.

SUMMARY

According to an embodiment, an electronic device may be provided. The electronic device may include an error occurrence control circuit, a data conversion circuit, a parity conversion circuit and a verification signal generation circuit. The error occurrence control circuit may be configured to generate an error insertion code that is counted whenever data is outputted during a read operation. The data conversion circuit may be configured to convert the data to generate internal data, in response to the error insertion code. The parity conversion circuit may be configured to convert a parity to generate an internal parity, in response to the error insertion code. The verification signal generation circuit may be configured to generate a verification signal from a syndrome signal and the error insertion code. The syndrome signal may be generated from the internal data and the internal parity.

According to an embodiment, an electronic device may be provided. The electronic device may include a parity generation circuit, a data conversion circuit, a parity conversion circuit, and a verification signal generation circuit. The parity generation circuit may be configured to perform a logical operation of logic levels of at least two selected from bits included in data to generate a parity, in response to an error check matrix. The data conversion circuit may be configured to convert the data to generate internal data, in response to an error insertion code. The parity conversion circuit may be configured to convert the parity to generate an internal parity, in response to the error insertion code. The verification signal generation circuit may be configured to generate a verification signal from a syndrome signal and the error insertion code. The syndrome signal may be generated from the internal data and the internal parity.

According to an embodiment, an electronic device may include an error occurrence control circuit, a data conversion circuit, a parity conversion circuit, and a verification signal generation circuit. The error occurrence control circuit may be configured to generate an error insertion code having a logic level combination corresponding to at least one of bits included in data and a parity according to an error check matrix. The data conversion circuit may be configured to invert a logic level of at least one of bits included in the data to generate internal data, according to a logic level combination of the error insertion code. The parity conversion circuit may be configured to invert a logic level of at least one of bits included in the parity to generate an internal parity, according to a logic level combination of the error insertion code. The verification signal generation circuit may be configured to generate a verification signal from a syndrome signal and the error insertion code. The syndrome signal may be generated from the internal data and the internal parity.

According to an embodiment, an electronic device may be provided. The electronic device may include a parity generation circuit, a data conversion circuit, and a verification signal generation circuit. The data conversion circuit may be configured to insert an erroneous bit into data corresponding to a bit location using an error insertion code generated by an error check matrix and generate internal data. The parity conversion circuit may be configured to insert an erroneous bit into a parity of the data corresponding to a bit location using the error insertion code and generate internal parity. The verification signal generation circuit may be configured to verify whether an error correction operation for the internal data and the internal parity has performed correctly by detecting whether the erroneous bits have been generated at the desired locations.

BRIEF DESCRIPTION OF THE DRAWINGS

FIG. 2 is a table illustrating an example of an error check matrix for realizing error correction codes used in the electronic device of FIG. 1.

FIG. 5 is a table illustrating various logic level combinations of an error insertion code generated by the error occurrence control circuit illustrated in FIG. 4.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

For reference, an embodiment including additional components may be provided. Furthermore, a logic high or logic low configuration indicating a state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Various embodiments may be directed to electronic devices configured to verify error correction codes.

Figure 1:
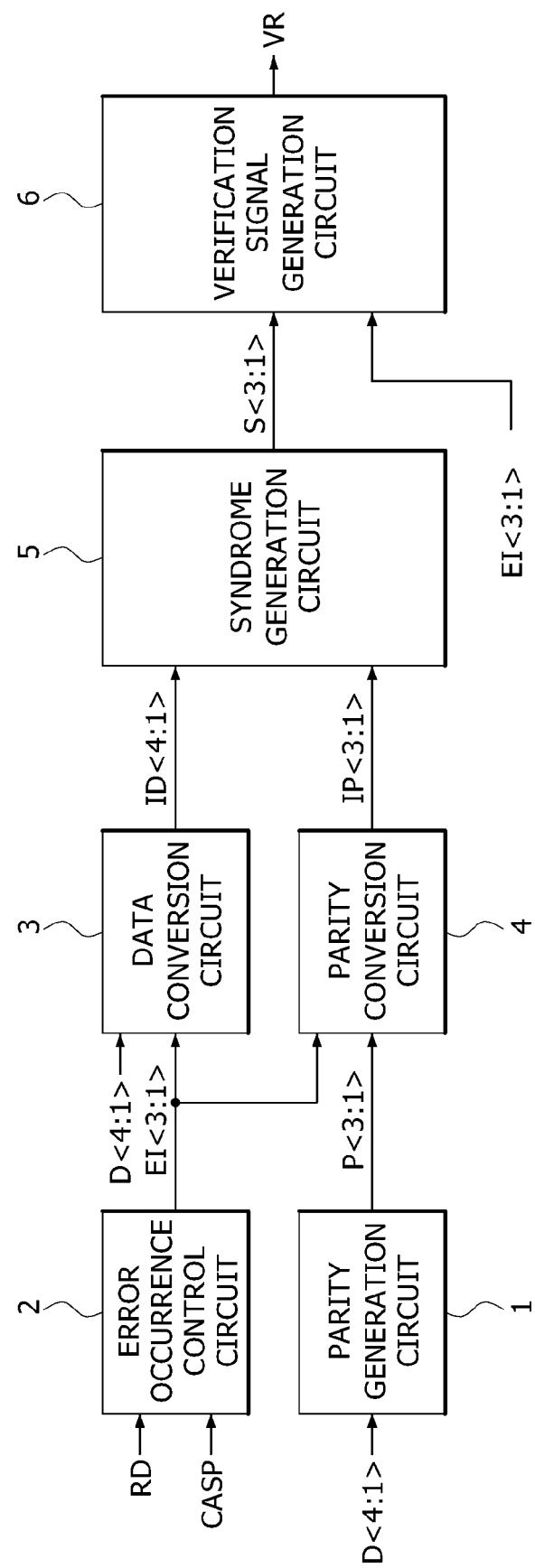
FIG. 1 is a block diagram illustrating a configuration of an electronic device according to an embodiment of the present disclosure.

Referring to FIG. 1, an electronic device according to an embodiment may include a parity generation circuit 1, an error occurrence control circuit 2, a data conversion circuit 3, a parity conversion circuit 4, a syndrome generation circuit 5 and a verification signal generation circuit 6.

The parity generation circuit 1 may receive data D<4:1> to generate a parity P<3:1>. The parity generation circuit 1 may perform a selective logical operation of bits included in the data D<4:1> to generate the parity P<3:1>. The parity P<3:1> may be generated by an error correction code (ECC) circuit using a Hamming code. The Hamming code may be realized by an error check matrix for correcting errors of data. A configuration and an operation of the parity generation circuit 1 will be described with reference to FIGS. 2 and 3 later.

The error occurrence control circuit 2 may generate an error insertion code EI<3:1> in response to a read signal RD and a column pulse CASP. The error occurrence control circuit 2 may generate the error insertion code EI<3:1> which is counted at a point of time that the column pulse CASP is created while the read signal RD is enabled. The read signal RD may be enabled to perform a read operation. The column pulse CASP may be created whenever the data D<4:1> are outputted from a memory cell array (not illustrated) during the read operation. A configuration and an operation of the error occurrence control circuit 2 will be described with reference to FIGS. 4 and 5 later.

The data conversion circuit 3 may generate internal data ID<4:1> from the data D<4:1> in response to the error insertion code EI<3:1>. The data conversion circuit 3 may generate the internal data ID<4:1> by inverting a logic level of a bit corresponding to a logic level combination of the error insertion code EI<3:1> among bits included in the data D<4:1>. The bit of the data D<4:1> corresponding to each logic level combination of the error insertion code EI<3:1> may be set to be different according to the embodiments. A configuration and an operation of the data conversion circuit 3 will be described with reference to FIG. 6 later.

The parity conversion circuit 4 may generate an internal parity IP<3:1> from the parity P<3:1> in response to the error insertion code EI<3:1>. The parity conversion circuit 4 may generate the internal parity IP<3:1> by inverting a logic level of a bit corresponding to a logic level combination of the error insertion code EI<3:1> among bits included in the parity P<3:1>. The bit of the parity P<3:1> corresponding to each logic level combination of the error insertion code EI<3:1> may be set to be different according to the embodiments. A configuration and an operation of the parity conversion circuit 4 will be described with reference to FIG. 7 later.

The syndrome generation circuit 5 may generate a syndrome signal S<3:1> in response to the internal data ID<4:1> and the internal parity IP<3:1>. The syndrome generation circuit 5 may perform a logical operation on bits included in the internal data ID<4:1> and the internal parity IP<3:1> to generate the syndrome signal S<3:1>. The syndrome signal S<3:1> may be generated by an error correction code (ECC) circuit using a Hamming code. The Hamming code may be realized by an error check matrix for correcting errors of data. A configuration and an operation of the syndrome generation circuit 5 will be described with reference to FIG. 8 later.

The verification signal generation circuit 6 may generate a verification signal VR in response to the error insertion code EI<3:1> and the syndrome signal S<3:1>. The verification signal generation circuit 6 may generate the verification signal VR having a first logic level if the error insertion code EI<3:1> is the same as the syndrome signal S<3:1>. The verification signal generation circuit 6 may generate the verification signal VR having a second logic level if the error insertion code EI<3:1> is different from the syndrome signal S<3:1>. The first logic level of the verification signal VR may be set to be a logic "high" level, and the second logic level of the verification signal VR may be set to be a logic "low" level. In some other embodiments, the first logic level of the verification signal VR may be set to be a logic "low" level, and the second logic level of the verification signal VR may be set to be a logic "high" level. A configuration and an operation of the verification signal generation circuit 6 will be described with reference to FIG. 9 later.

Referring to FIG. 2, an error check matrix used in an electronic device according to an embodiment is illustrated. The error check matrix used in the electronic device according to an embodiment may include a first matrix 1st MATRIX and a second matrix 2nd MATRIX.

The first matrix 1st MATRIX may include information on whether bits of the parity P<3:1> have an error. If the syndrome signal S<3:1> is generated to have a logic level combination of '0,0,1' which is identical to a logic level combination of a first column of the first matrix 1st MATRIX, a first bit P<1> of the parity P<3:1> may be regarded as an erroneous bit. In the syndrome signal S<3:1>, the logic level combination of '0,0,1' means that a first bit S<1> of the syndrome signal S<3:1> has a logic "high" level and both of second and third bits S<2:3> of the syndrome signal S<3:1> have a logic "low" level. If the syndrome signal S<3:1> is generated to have a logic level combination of '0,1,0' which is identical to a logic level combination of a second column of the first matrix 1st MATRIX, a second bit P<2> of the parity P<3:1> may be regarded as an erroneous bit. If the syndrome signal S<3:1> is generated to have a logic level combination of '1,0,0' which is identical to a logic level combination of a third column of the first matrix 1st MATRIX, a third bit P<3> of the parity P<3:1> may be regarded as an erroneous bit. Hereinafter, a logic level having a value of '1' may means a logic "high" level, and a logic level having a value of '0' may means a logic "low" level.

The second matrix 2nd MATRIX may include information on whether bits of the parity P<3:1> are erroneous bits. If the syndrome signal S<3:1> is generated to have a logic level combination of '0,1,1' which is identical to a logic level combination of a first column of the second matrix 2nd MATRIX, a first bit D<1> of the data D<4:1> may be regarded as an erroneous bit. If the syndrome signal S<3:1> is generated to have a logic level combination of '1,0,1' which is identical to a logic level combination of a second column of the second matrix 2nd MATRIX, a second bit D<2> of the data D<4:1> may be regarded as an erroneous bit. If the syndrome signal S<3:1> is generated to have a logic level combination of '1,1,0' which is identical to a logic level combination of a third column of the second matrix 2nd MATRIX, a third bit D<3> of the data D<4:1> may be regarded as an erroneous bit. If the syndrome signal S<3:1> is generated to have a logic level combination of '1,1,1' which is identical to a logic level combination of a fourth column of the second matrix 2nd MATRIX, a fourth bit D<4> of the data D<4:1> may be regarded as an erroneous bit.

The second matrix 2nd MATRIX may include information on logic level combinations of bits included in the data <4:1> in order to generate the parity P<3:1>. Since a first row of the second matrix 2nd MATRIX has a logic level combination of '1,1,0,1', a logic level of the first bit P<1> of the parity P<3:1> may be generated by an exclusive logical operation of the first bit D<1>, the second bit D<2> and the fourth bit <D4> of the data D<4:1>. Since a second row of the second matrix 2nd MATRIX has a logic level combination of '1,0,1,1', a logic level of the second bit P<2> of the parity P<3:1> may be generated by an exclusive logical operation of the first bit D<1>, the third bit D<3> and the fourth bit <D4> of the data D<4:1>. Since a third row of the second matrix 2nd MATRIX has a logic level combination of '0,1,1,1', a logic level of the third bit P<3> of the parity P<3:1> may be generated by an exclusive logical operation of the second bit D<2>, the third bit D<3> and the fourth bit <D4> of the data D<4:1>.

Figure 3:
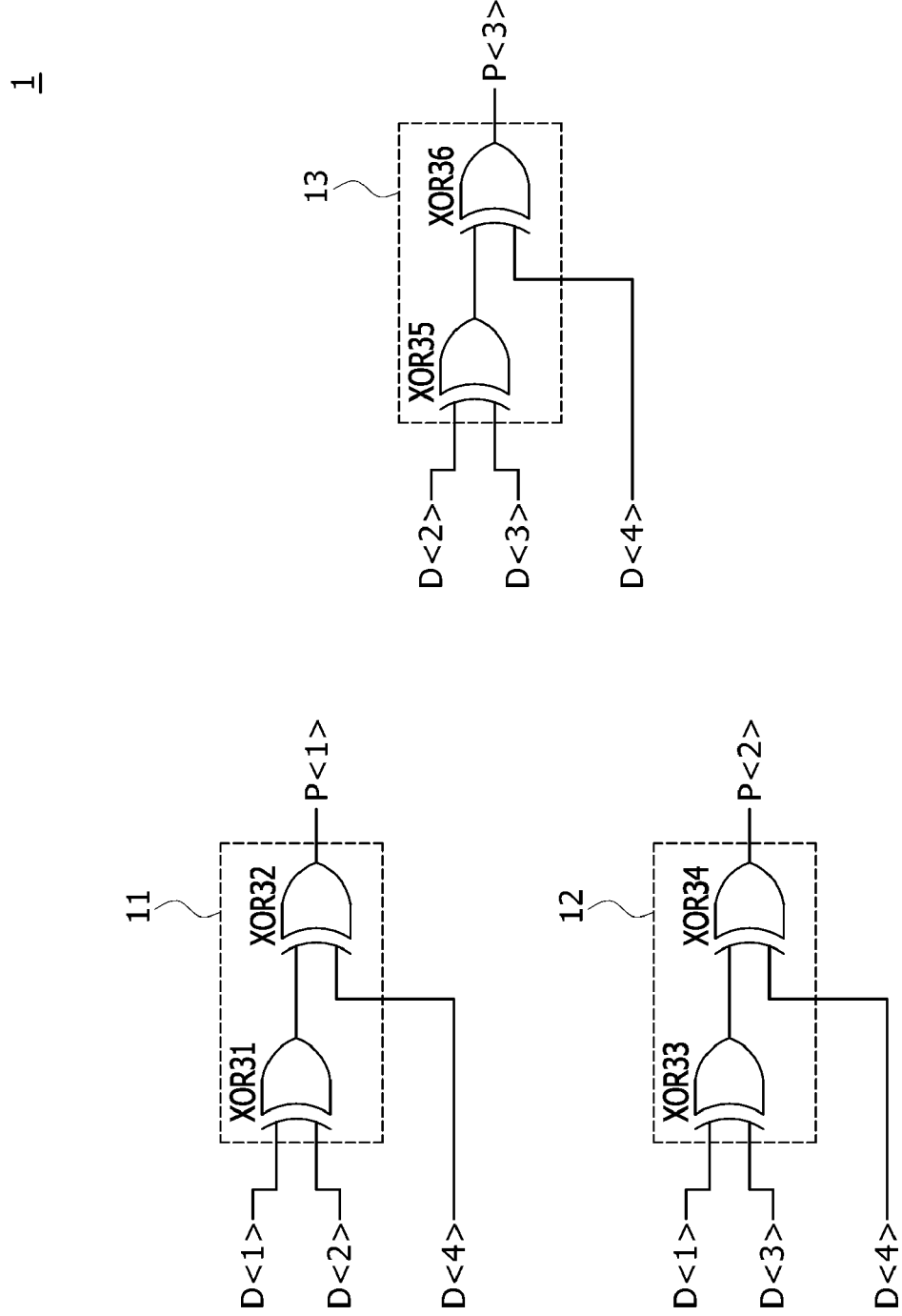
FIG. 3 is a circuit diagram illustrating an example of a parity generation circuit included in the electronic device of FIG. 1.

Referring to FIG. 3, the parity generation circuit 1 may include a first parity generation circuit 11, a second parity generation circuit 12 and a third parity generation circuit 13. The first parity generation circuit 11 may perform an exclusive logical operation of the first bit D<1>, the second bit D<2> and the fourth bit D<4> of the data D<4:1> to generate the first bit P<1> of the parity P<3:1> since the first row of the second matrix 2nd MATRIX illustrated in FIG. 2 has a logic level combination of '1,1,0,1'. The second parity generation circuit 12 may perform an exclusive logical operation of the first bit D<1>, the third bit D<3> and the fourth bit D<4> of the data D<4:1> to generate the second bit P<2> of the parity P<3:1> since the second row of the second matrix 2nd MATRIX illustrated in FIG. 2 has a logic level combination of '1,0,1,1'. The third parity generation circuit 13 may perform an exclusive logical operation of the second bit D<2>, the third bit D<3> and the fourth bit D<4> of the data D<4:1> to generate the third bit P<3> of the parity P<3:1> since the third row of the second matrix 2nd MATRIX illustrated in FIG. 2 has a logic level combination of '0,1,1,1'. In an embodiment, for example, the first parity generation circuit 11 may include logic gates for performing the exclusive OR operations. For example, the first parity generation circuit 11 may include exclusive OR gates XOR31 and XOR32. The exclusive OR gate XOR31 may be configured to receive and perform an exclusive OR operation on the first and second bits D<1:2>, and output a resultant signal. The exclusive OR gate XOR32 may be configured to receive and perform an exclusive OR operation on the fourth bit D<4> and the resultant signal, and output the first bit P<1>. The second parity generation circuit 12 may include, for example, exclusive OR gates XOR33 and XOR34. The second parity generation circuit 12 may be configured in the same way as the first parity generation circuit 11 except that the designations of the signals inputted thereto and outputted therefrom are different. The third parity generation circuit 13 may include, for example, exclusive OR gates XOR35 and XOR36. The third parity generation circuit 13 may be configured in the same way as the first parity generation circuit 11 except that the designations of the signals inputted thereto and outputted therefrom are different.

Figure 4:
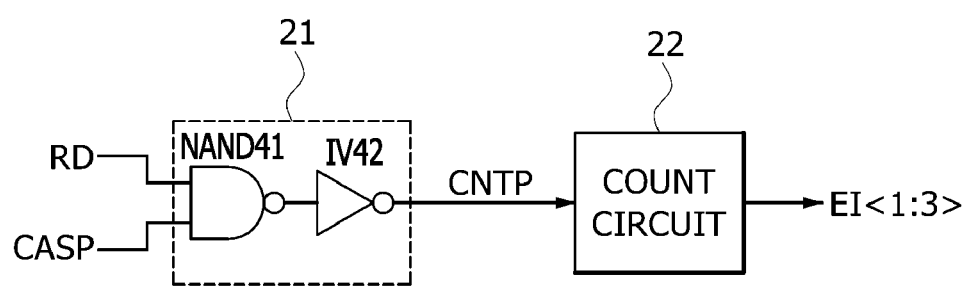
FIG. 4 illustrates an example of an error occurrence control circuit included in the electronic device of FIG. 1.

Referring to FIG. 4, the error occurrence control circuit 2 may include a count pulse generation circuit 21 and a count circuit 22. The count pulse generation circuit 21 may generate a count pulse CNTP in response to the read signal RD and the column pulse CASP. The count pulse generation circuit 21 may generate the count pulse CNTP whenever the column pulse CASP is created by the data D<4:1> outputted from a memory cell array (not illustrated) while the read signal RD is enabled to perform the read operation. In an embodiment, for example, the count pulse generation circuit 21 may be configured to perform a NAND logic operation on the read signal RD and the column pulse signal CASP, output a resultant signal, and perform an inversion operation on the resultant signal to output the count pulse CNTP. For example, the count pulse generation circuit 21 may include a NAND gate NAND41 and an inverter IV42. The NAND gate NAND41 may perform a NAND operation on the read signal RD and the column pulse CASP, and output a resultant signal. The inverter IV42 may invert the resultant signal and output the count pulse CNTP. The count circuit 22 may generate the error insertion code EI<3:1> that is sequentially counted whenever the count pulse CNTP is created.

Referring to FIG. 5, various logic level combinations of the error insertion code EI<3:1> generated by the error occurrence control circuit 2 of FIG. 4 are illustrated. The error insertion code EI<3:1> may be counted to have a logic level combination of '0,0,1' if a first one of the count pulse CNTP is created while the error insertion code EI<3:1> has a logic level combination of '0,0,0'. In the error insertion code EI<3:1>, the logic level combination of '0,0,1' means that the first bit EI<1> of the error insertion code EI<3:1> has a logic "high' level and both of the second and third bits EI<3:2> of the error insertion code EI<3:1> has a logic "low' level. The error insertion code EI<3:1> may be counted to have a logic level combination of '0,1,0' if a second one of the count pulse CNTP is created, and the error insertion code EI<3:1> may be counted to have a logic level combination of '0,1,1' if a third one of the count pulse CNTP is created. In addition, the error insertion code EI<3:1> may be counted to have a logic level combination of '1,0,0' if a fourth one of the count pulse CNTP is created, and the error insertion code EI<3:1> may be counted to have a logic level combination of '1,0,1' if a fifth one of the count pulse CNTP is created. Moreover, the error insertion code EI<3:1> may be counted to have a logic level combination of '1,1,0' if a sixth one of the count pulse CNTP is created, and the error insertion code EI<3:1> may be counted to have a logic level combination of '1,1,1' if a seventh one of the count pulse CNTP is created.

A logic level combination of '0,0,1' in the error insertion code EI<3:1> may be identical to a logic level combination of the syndrome signal S<3:1> generated when the first bit P<1> of the parity P<3:1> is an erroneous bit. A logic level combination of '0,1,0' in the error insertion code EI<3:1> may be identical to a logic level combination of the syndrome signal S<3:1> generated when the second bit P<2> of the parity P<3:1> is an erroneous bit. A logic level combination of '0,1,1' in the error insertion code EI<3:1> may be identical to a logic level combination of the syndrome signal S<3:1> generated when the first bit D<1> of the data D<4:1> is an erroneous bit. A logic level combination of '1,0,0' in the error insertion code EI<3:1> may be identical to a logic level combination of the syndrome signal S<3:1> generated when the third bit P<3> of the parity P<3:1> is an erroneous bit. A logic level combination of '1,0,1' in the error insertion code EI<3:1> may be identical to a logic level combination of the syndrome signal S<3:1> generated when the second bit D<2> of the data D<4:1> is an erroneous bit. A logic level combination of '1,1,0' in the error insertion code EI<3:1> may be identical to a logic level combination of the syndrome signal S<3:1> generated when the third bit D<3> of the data D<4:1> is an erroneous bit. A logic level combination of '1,1,1' in the error insertion code EI<3:1> may be identical to a logic level combination of the syndrome signal S<3:1> generated when the fourth bit D<4> of the data D<4:1> is an erroneous bit.

Figure 6:
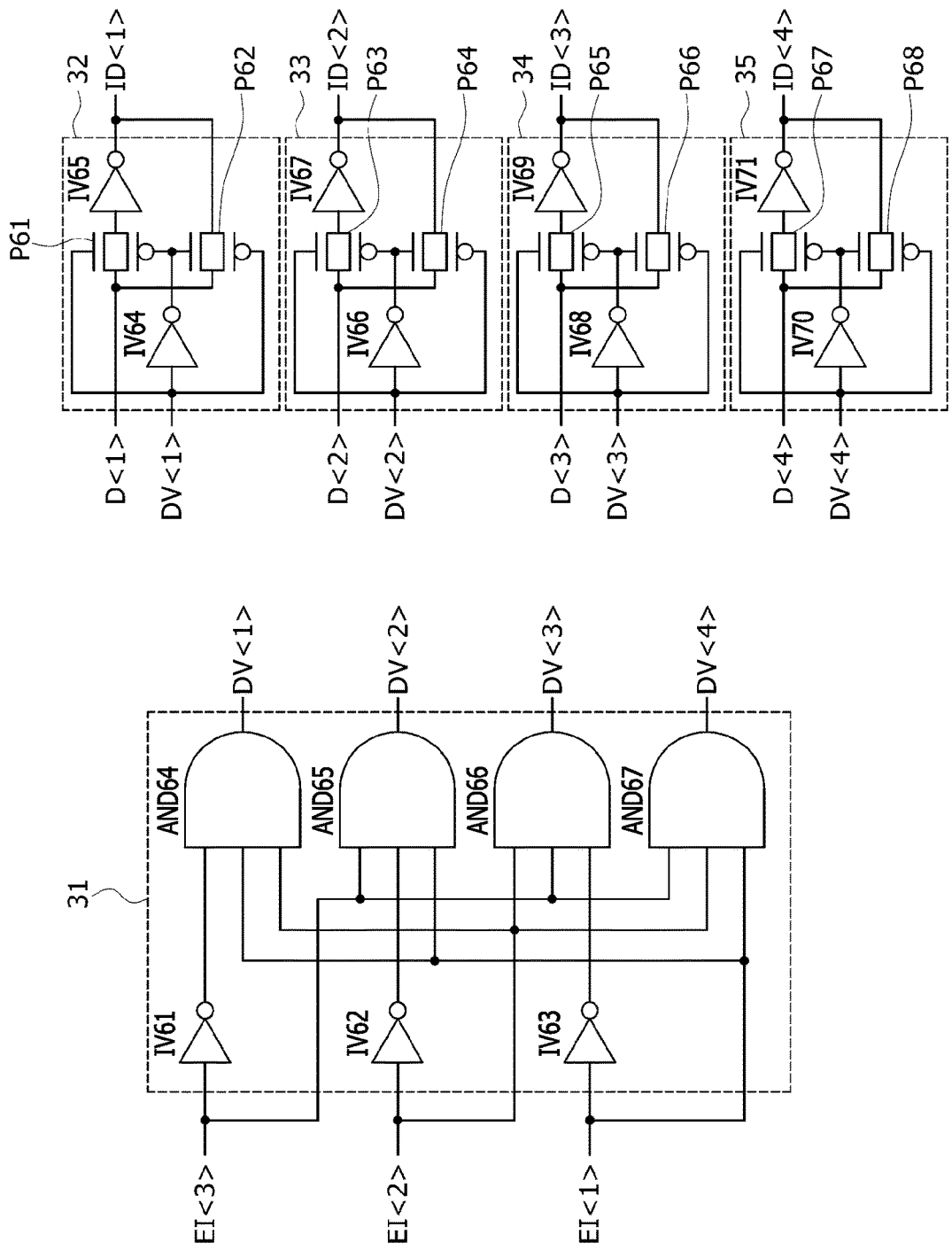
FIG. 6 is a circuit diagram illustrating an example of a data conversion circuit included in the electronic device of FIG. 1.

Referring to FIG. 6, the data conversion circuit 3 may include a data conversion signal generation circuit 31, a first internal data generation circuit 32, a second internal data generation circuit 33, a third internal data generation circuit 34 and a fourth internal data generation circuit 35.

The data conversion signal generation circuit 31 may generate a first conversion datum DV<1> having a logic "high" level when the error insertion code EI<3:1> has a logic level combination of '0,1,1'. The data conversion signal generation circuit 31 may generate a second conversion datum DV<2> having a logic "high" level when the error insertion code EI<3:1> has a logic level combination of '1,0,1'. The data conversion signal generation circuit 31 may generate a third conversion datum DV<3> having a logic "high" level when the error insertion code EI<3:1> has a logic level combination of '1,1,0'. The data conversion signal generation circuit 31 may generate a fourth conversion datum DV<4> having a logic "high" level when the error insertion code EI<3:1> has a logic level combination of '1,1,1'. In an embodiment, for example, the data conversion signal generation circuit 31 may be configured to perform AND operations and inversion operations on the error insertion code EI<3:1>. For example, data conversion signal generation circuit 31 may include inverters IV61, IV62, and IV63, and AND gates AND64-AND67. For example, the inverter IV61 may invert the bit EI<3> and output a resultant signal, and the AND gate AND64 may perform an AND operation with the resultant signal and the bits EI<2> and EI<1> to output the first conversion datum DV<1>. For example, the inverter IV62 may invert the bit EI<2> and output a resultant signal, and the AND gate AND65 may perform an AND operation with the resultant signal and bits EI<3> and EI<1> to output the second conversion datum DV<2>. For example, the inverter IV63 may invert the bit EI<1> and output a resultant signal, and the AND gate AND66 may perform an AND operation with the resultant signal and bits EI<2> and EI<3> to output the third conversion datum DV<3>. For example, the AND gate AND67 may perform an AND operation with error insertion code EI<3:1> to output the fourth conversion datum DV<4>.

The first internal data generation circuit 32 may invert a logic level of the first bit D<1> of the data D<4:1> to generate a first bit ID<1> of the internal data ID<4:1> if the first conversion datum DV<1> has a logic "high" level. If the first conversion datum DV<1> has a logic "high" level due to the error insertion code EI<3:1> having a logic level combination of '0,1,1', the first internal data generation circuit 32 may invert a logic level of the first bit D<1> of the data D<4:1> to cause an error of the first bit ID<1> of the internal data ID<4:1>. In an embodiment, for example, the first internal data generation circuit 32 may include inverters IV64 and IV65, and pass gates PG1 and PG2. The inverter IV64 may be inputted with the first conversion datum DV<1> and output a resultant signal. The pass gate PG1 may have an input terminal which is inputted with the first bit D<1>, a first control terminal which is inputted with the first conversion datum DV<1>, a second control terminal which is inputted with the resultant signal from the inverter IV64, and an output terminal which outputs a resultant signal. The inverter IV65 may be inputted with the resultant signal output from the pass gate PG1 and output the first bit ID<1> of the internal data ID<4:1>. The pass gate PG2 may have an input terminal which is inputted with the first bit D<1>, a first control terminal which is inputted with the resultant signal outputted from the inverter IV64, a second control terminal which is inputted with the first conversion datum DV<1>, and an output terminal which outputs the first bit ID<1> of the internal data ID<4:1>.

The second internal data generation circuit 33 may invert a logic level of the second bit D<2> of the data D<4:1> to generate a second bit ID<2> of the internal data ID<4:1> if the second conversion datum DV<2> has a logic "high" level. If the second conversion datum DV<2> has a logic "high" level due to the error insertion code EI<3:1> having a logic level combination of '1,0,1', the second internal data generation circuit 33 may invert a logic level of the second bit D<2> of the data D<4:1> to cause an error of the second bit ID<2> of the internal data ID<4:1>. The second internal data generation circuit 33 may include inverters IV66 and IV67 and pass gates PG3 and PG4. The second internal data generation circuit 33 may be configured in the same way as the first internal data generation circuit 32 except that the designations of the signals inputted thereto and outputted therefrom are different.

The third internal data generation circuit 34 may invert a logic level of the third bit D<3> of the data D<4:1> to generate a third bit ID<3> of the internal data ID<4:1> if the third conversion datum DV<3> has a logic "high" level. If the third conversion datum DV<3> has a logic "high" level due to the error insertion code EI<3:1> having a logic level combination of '1,1,0', the third internal data generation circuit 34 may invert a logic level of the third bit D<3> of the data D<4:1> to cause an error of the third bit ID<3> of the internal data ID<4:1>. The third internal data generation circuit 34 may include inverters IV68 and IV69 and pass gates PG5 and PG6. The third internal data generation circuit 34 may be configured in the same way as the first internal data generation circuit 32 except that the designations of the signals inputted thereto and outputted therefrom are different.

The fourth internal data generation circuit 35 may invert a logic level of the fourth bit D<4> of the data D<4:1> to generate a fourth bit ID<4> of the internal data ID<4:1> if the fourth conversion datum DV<4> has a logic "high"

level. If the fourth conversion datum DV<4> has a logic "high" level due to the error insertion code EI<3:1> having a logic level combination of '1,1,1', the fourth internal data generation circuit 35 may invert a logic level of the fourth bit D<4> of the data D<4:1> to cause an error of the fourth bit ID<4> of the internal data ID<4:1>. The fourth internal data generation circuit 35 may include inverters IV70 and IV71 and pass gates PG7 and PG8. The fourth internal data generation circuit 35 may be configured in the same way as the first internal data generation circuit 32 except that the designations of the signals inputted thereto and outputted therefrom are different.

Figure 7:
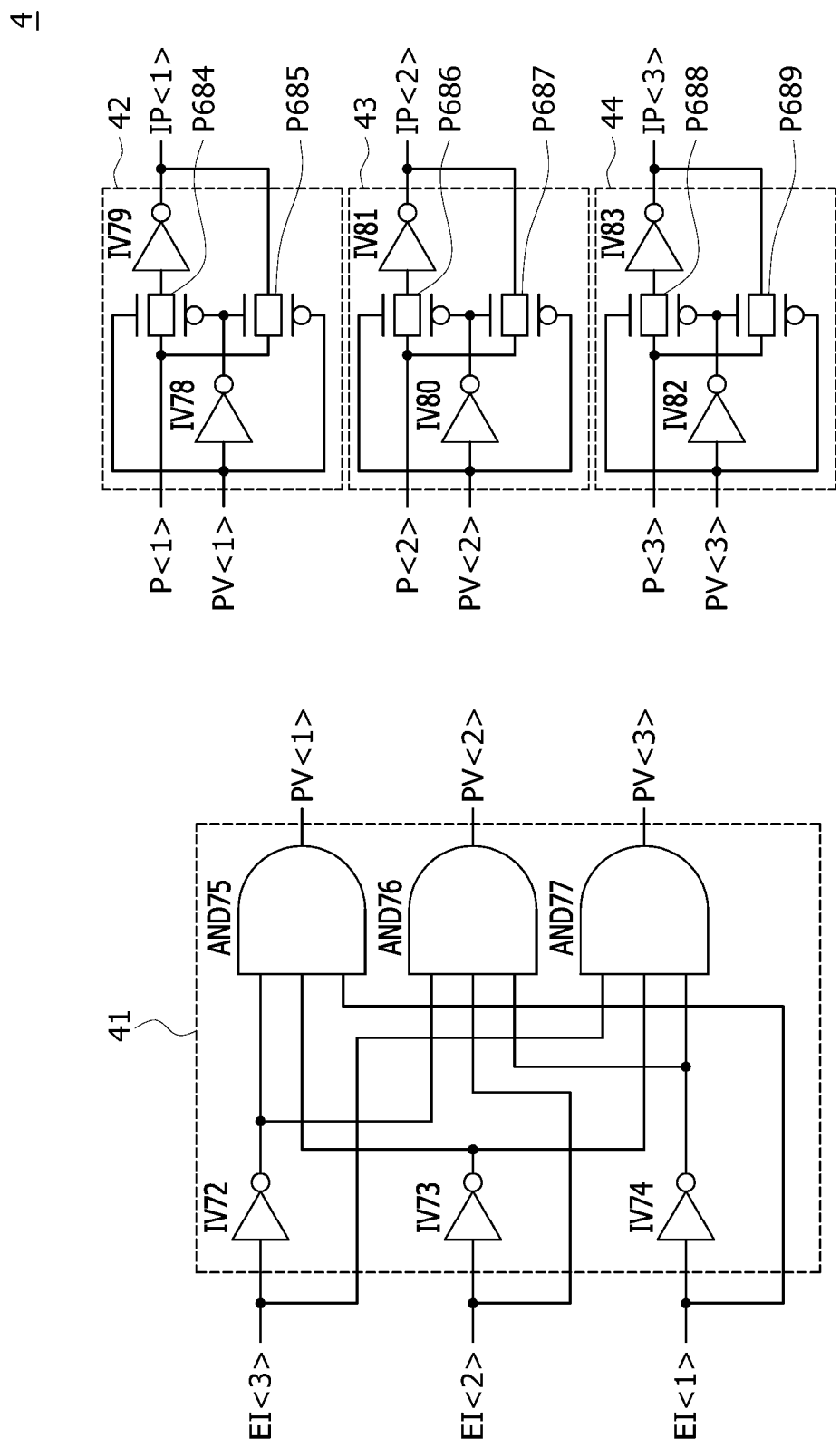
FIG. 7 is a circuit diagram illustrating an example of a parity conversion circuit included in the electronic device of FIG. 1.

Referring to FIG. 7, the parity conversion circuit 4 may include a parity conversion signal generation circuit 41, a first internal parity generation circuit 42, a second internal parity generation circuit 43 and a third internal parity generation circuit 44.

The parity conversion signal generation circuit 41 may generate a first conversion parity PV<1> having a logic "high" level when the error insertion code EI<3:1> has a logic level combination of '0,0,1'. The parity conversion signal generation circuit 41 may generate a second conversion parity PV<2> having a logic "high" level when the error insertion code EI<3:1> has a logic level combination of '0,1,0'. The parity conversion signal generation circuit 41 may generate a third conversion parity PV<3> having a logic "high" level when the error insertion code EI<3:1> has a logic level combination of '1,0,0'. In an embodiment, for example, the parity conversion signal generation circuit 41 may be configured to perform AND operations and inversion operations on the error insertion code EI<3:1>. For example, parity conversion signal generation circuit 41 may include inverters IV72, IV73, and IV74, and AND gates AND75-AND77. For example, the inverter IV72 may invert the bit EI<3> and output a resultant signal, the inverter IV73 may invert the bit EI<2> and output a resultant signal, and the inverter IV74 may invert the bit EI<1> and output a resultant signal. The AND gate AND75 may perform an AND operation with the resultant signals of inverters IV72 and IV73 and bit EI<1> to output the first conversion parity PV<1>. The AND gate AND76 may perform an AND operation with the resultant signals of inverters IV72 and IV74 and bit EI<2> to output the second conversion parity PV<2>. The AND gate AND77 may perform an AND operation with the resultant signals of inverters IV73 and IV74 and bit EI<3> to output the first conversion parity PV<3>.

The first internal parity generation circuit 42 may invert a logic level of the first bit P<1> of the parity P<3:1> to generate a first bit IP<1> of the internal parity IP<3:1> if the first conversion parity PV<1> has a logic "high" level. If the first conversion parity PV<1> has a logic "high" level due to the error insertion code EI<3:1> having a logic level combination of '0,0,1', the first internal parity generation circuit 42 may invert a logic level of the first bit P<1> of the parity P<3:1> to cause an error of the first bit IP<1> of the internal parity IP<3:1>. In an embodiment, for example, the first internal parity generation circuit 42 may include inverters IV78 and IV79, and pass gates PG84 and PG85. The inverter IV78 may be inputted with the first conversion parity PV<1> and output a resultant signal. The pass gate PG84 may have an input terminal which is inputted with the first bit P<1>, a first control terminal which is inputted with the first conversion parity PV<1>, a second control terminal which is inputted with the resultant signal from the inverter IV78, and an output terminal which outputs a resultant signal. The inverter IV79 may be inputted with the resultant signal output from the pass gate PG84 and output the first bit IP<1> of the internal parity IP<3:1>. The pass gate PG85 may have an input terminal which is inputted with the first bit P<1>, a first control terminal which is inputted with the resultant signal outputted from the inverter IV78, a second control terminal which is inputted with the first conversion parity PV<1>, and an output terminal which outputs the first bit IP<1> of the internal data IP<3:1>.

The second internal parity generation circuit 43 may invert a logic level of the second bit P<2> of the parity P<3:1> to generate a second bit IP<2> of the internal parity IP<3:1> if the second conversion parity PV<2> has a logic "high" level. If the second conversion parity PV<2> has a logic "high" level due to the error insertion code EI<3:1> having a logic level combination of '0,1,0', the second internal parity generation circuit 43 may invert a logic level of the second bit P<2> of the parity P<3:1> to cause an error of the second bit IP<2> of the internal parity IP<3:1>. The second internal parity generation circuit 42 may include inverters IV78 and IV79 and pass gates PG84 and PG85. The second internal parity generation circuit 43 may be configured in the same way as the first internal parity generation circuit 42 except that the designations of the signals inputted thereto and outputted therefrom are different.

The third internal parity generation circuit 44 may invert a logic level of the third bit P<3> of the parity P<3:1> to generate a third bit IP<3> of the internal parity IP<3:1> if the third conversion parity PV<3> has a logic "high" level. If the third conversion parity PV<3> has a logic "high" level due to the error insertion code EI<3:1> having a logic level combination of '1,0,0', the third internal parity generation circuit 44 may invert a logic level of the third bit P<3> of the parity P<3:1> to cause an error of the third bit IP<3> of the internal parity IP<3:1>. The third internal parity generation circuit 44 may include inverters IV82 and IV83 and pass gates PG88 and PG89. The third internal parity generation circuit 44 may be configured in the same way as the first internal parity generation circuit 42 except that the designations of the signals inputted thereto and outputted therefrom are different.

Figure 8:
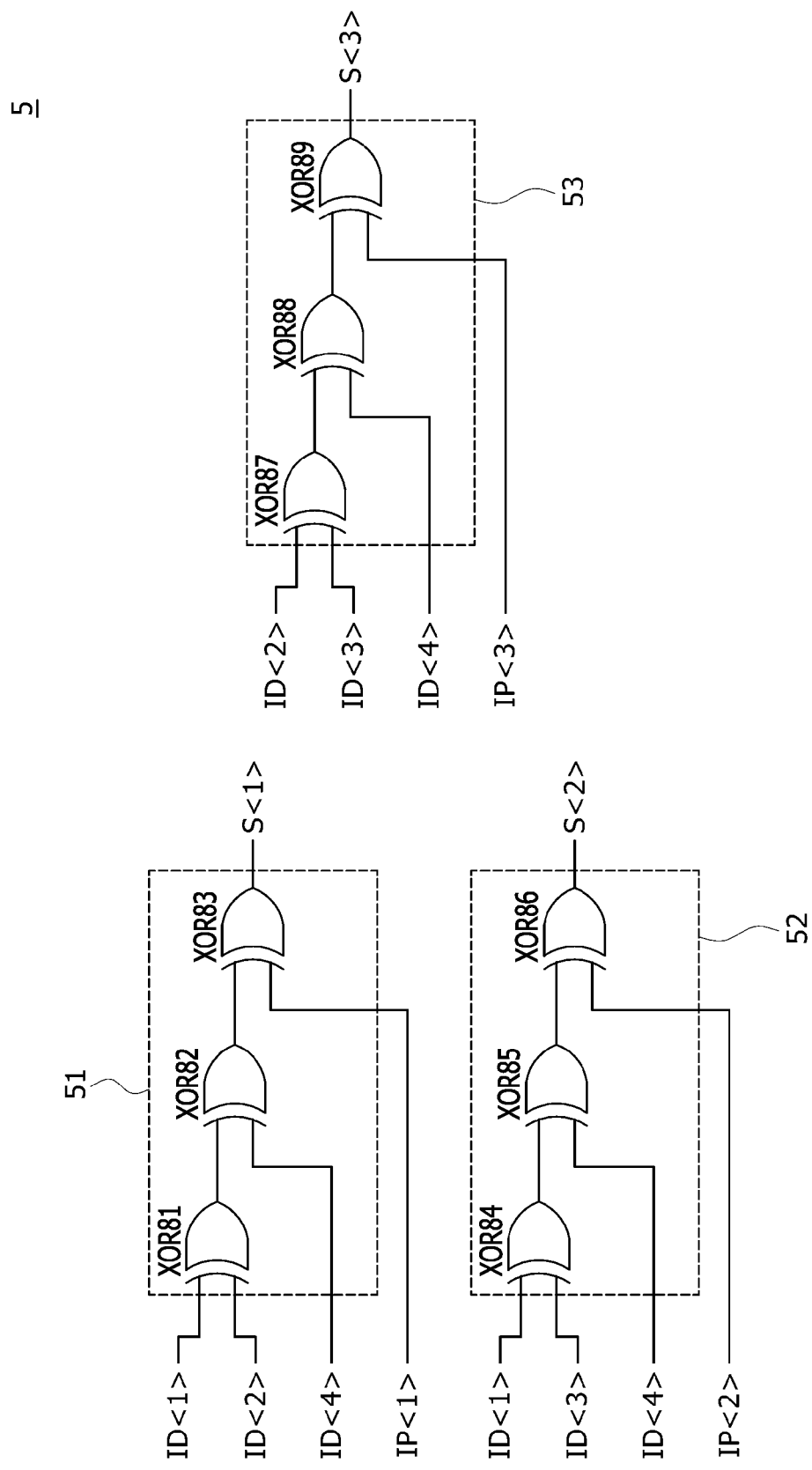
FIG. 8 is a circuit diagram illustrating an example of a syndrome generation circuit included in the electronic device of FIG. 1.

Referring to FIG. 8, the syndrome generation circuit 5 may include a first syndrome generation circuit 51, a second syndrome generation circuit 52 and a third syndrome generation circuit 53.

The first syndrome generation circuit 51 may perform an exclusive logical operation of the first bit ID<1> of the internal data ID<4:1>, the second bit ID<2> of the internal data ID<4:1>, the fourth bit ID<4> of the internal data ID<4:1>, and the first bit IP<1> of the internal parity IP<3:1> to generate a first bit S<1> of the syndrome signal S<3:1>. A logical operation equation for generating the first bit S<1> of the syndrome signal S<3:1> may be determined by a logic level combination of '1,0,0' in the first row of the first matrix 1st MATRIX and a logic level combination of '1,1,0,1' in the first row of the second matrix 2nd MATRIX. In an embodiment, for example, the first syndrome generation circuit 51 may include exclusive OR gates XOR81 to XOR83. The exclusive OR gate XOR81 may be inputted with the first and second bits ID<2:1> to output a resultant signal. The exclusive OR gate XOR82 may be inputted with the resultant signal outputted from the exclusive or gate XOR81 and the fourth bit ID<4> to output a resultant signal. The exclusive OR gate XOR83 may be inputted with the resultant signal outputted from the exclusive or gate XOR82 and the first bit IP<1> to output the first bit S<1> of the syndrome signal S<3:1>.

The second syndrome generation circuit 52 may perform an exclusive logical operation of the first bit ID<1> of the internal data ID<4:1>, the third bit ID<3> of the internal data ID<4:1>, the fourth bit ID<4> of the internal data ID<4:1>, and the second bit IP<2> of the internal parity IP<3:1> to generate a second bit S<2> of the syndrome signal S<3:1>. A logical operation equation for generating the second bit S<2> of the syndrome signal S<3:1> may be determined by a logic level combination of '0,1,0' in the second row of the first matrix 1st MATRIX and a logic level combination of '1,0,1,1' in the second row of the second matrix 2nd MATRIX. The second syndrome generation circuit 52 may include exclusive OR gates XOR84 to XOR86. The second syndrome generation circuit 52 may be configured in the same way as the first syndrome generation circuit 51 except that the designations of the signals inputted thereto and outputted therefrom are different.

The third syndrome generation circuit 53 may perform an exclusive logical operation of the second bit ID<2> of the internal data ID<4:1>, the third bit ID<3> of the internal data ID<4:1>, the fourth bit ID<4> of the internal data ID<4:1>, and the third bit IP<3> of the internal parity IP<3:1> to generate a third bit S<3> of the syndrome signal S<3:1>. A logical operation equation for generating the third bit S<3> of the syndrome signal S<3:1> may be determined by a logic level combination of '0,0,1' in the third row of the first matrix 1st MATRIX and a logic level combination of '0,1,1,1' in the third row of the second matrix 2nd MATRIX. The third syndrome generation circuit 53 may include exclusive OR gates XOR87 to XOR89. The third syndrome generation circuit 53 may be configured in the same way as the first syndrome generation circuit 51 except that the designations of the signals inputted thereto and outputted therefrom are different.

Figure 9:
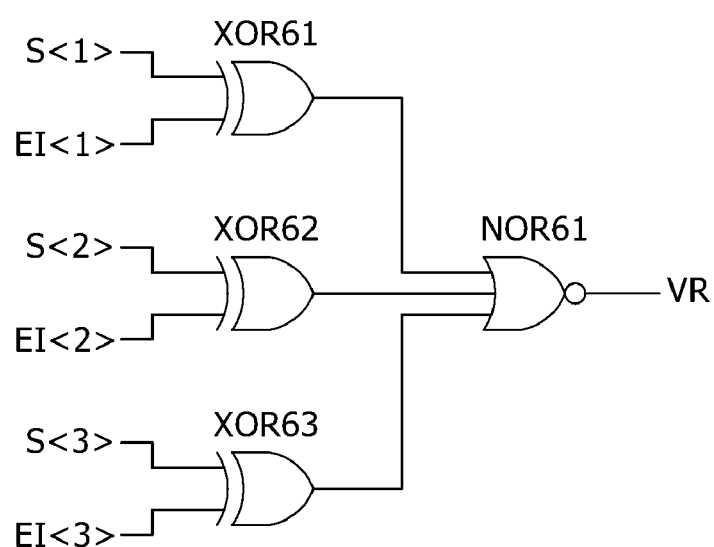
FIG. 9 is a circuit diagram illustrating an example of a verification signal generation circuit included in the electronic device of FIG. 1.

Referring to FIG. 9, the verification signal generation circuit 6 may include logic gates for performing exclusive OR operations, for example but not limited to, exclusive OR gates XOR61, XOR62 and XOR63. The verification signal generation circuit 6 may include logic gates for performing a NOR operation, for example but not limited to, a NOR gate NOR61. The exclusive OR gate XOR61 may perform an exclusive OR operation of the first bit S<1> of the syndrome signal S<3:1> and the first bit EI<1> of the error insertion code EI<3:1>. The exclusive OR gate XOR61 may output a signal having a logic "low" level if the first bit S<1> of the syndrome signal S<3:1> and the first bit EI<1> of the error insertion code EI<3:1> have the same logic level and may output a signal having a logic "high" level if the first bit S<1> of the syndrome signal S<3:1> and the first bit EI<1> of the error insertion code EI<3:1> have different logic levels. The exclusive OR gate XOR62 may perform an exclusive OR operation of the second bit S<2> of the syndrome signal S<3:1> and the second bit EI<2> of the error insertion code EI<3:1>. The exclusive OR gate XOR62 may output a signal having a logic "low" level if the second bit S<2> of the syndrome signal S<3:1> and the second bit EI<2> of the error insertion code EI<3:1> have the same logic level and may output a signal having a logic "high" level if the second bit S<2> of the syndrome signal S<3:1> and the second bit EI<2> of the error insertion code EI<3:1> have different logic levels. The exclusive OR gate XOR63 may perform an exclusive OR operation of the third bit S<3> of the syndrome signal S<3:1> and the third bit EI<3> of the error insertion code EI<3:1>. The exclusive OR gate XOR63 may output a signal having a logic "low" level if the third bit S<3> of the syndrome signal S<3:1> and the third bit EI<3> of the error insertion code EI<3:1> have the same logic level and may output a signal having a logic "high" level if the third bit S<3> of the syndrome signal S<3:1> and the third bit EI<3> of the error insertion code EI<3:1> have different logic levels. The NOR gate NOR61 may output the verification signal VR having a logic "high" level if all of the output signals of the exclusive OR gates XOR61, XOR62 and XOR63 have a logic "low" level. The NOR gate NOR61 may output the verification signal VR having a logic "low" level if at least one of the output signals of the exclusive OR gates XOR61, XOR62 and XOR63 have a logic "high" level.

The verification signal generation circuit 6 may generate the verification signal VR having a logic "high" level if the syndrome signal S<3:1> and the error insertion code EI<3:1> have the same logic level combination. The verification signal generation circuit 6 may generate the verification signal VR having a logic "low" level if the syndrome signal S<3:1> and the error insertion code EI<3:1> have different logic level combinations.

The electronic device according to an embodiment may generate the error insertion code EI<3:1> using an error check matrix and may include errors into the data D<4:1> and the parity P<3:1> to generate the internal data ID<4:1> and the internal parity IP<3:1> according to a logic level combination of the error insertion code EI<3:1>. The electronic device according to an embodiment may generate the syndrome signal S<3:1> in response to the internal data ID<4:1> including an error and the internal parity IP<3:1> including an error and may verify whether an error correction operation is normally performed by the error check matrix according to identity or non-identity of the syndrome signal S<3:1> and the error insertion code EI<3:1>. That is, the electronic device according to an embodiment may generate an error at a desired location and may verify whether the error correction operation is normally performed by detecting whether the error is generated at the desired location.

According to the embodiments described above, an error of data may be generated by an error correction code (ECC) and it may be possible to verify whether an error correction operation using the ECC is normally performed by a syndrome signal which is generated from the data including the error.

Figure 10:
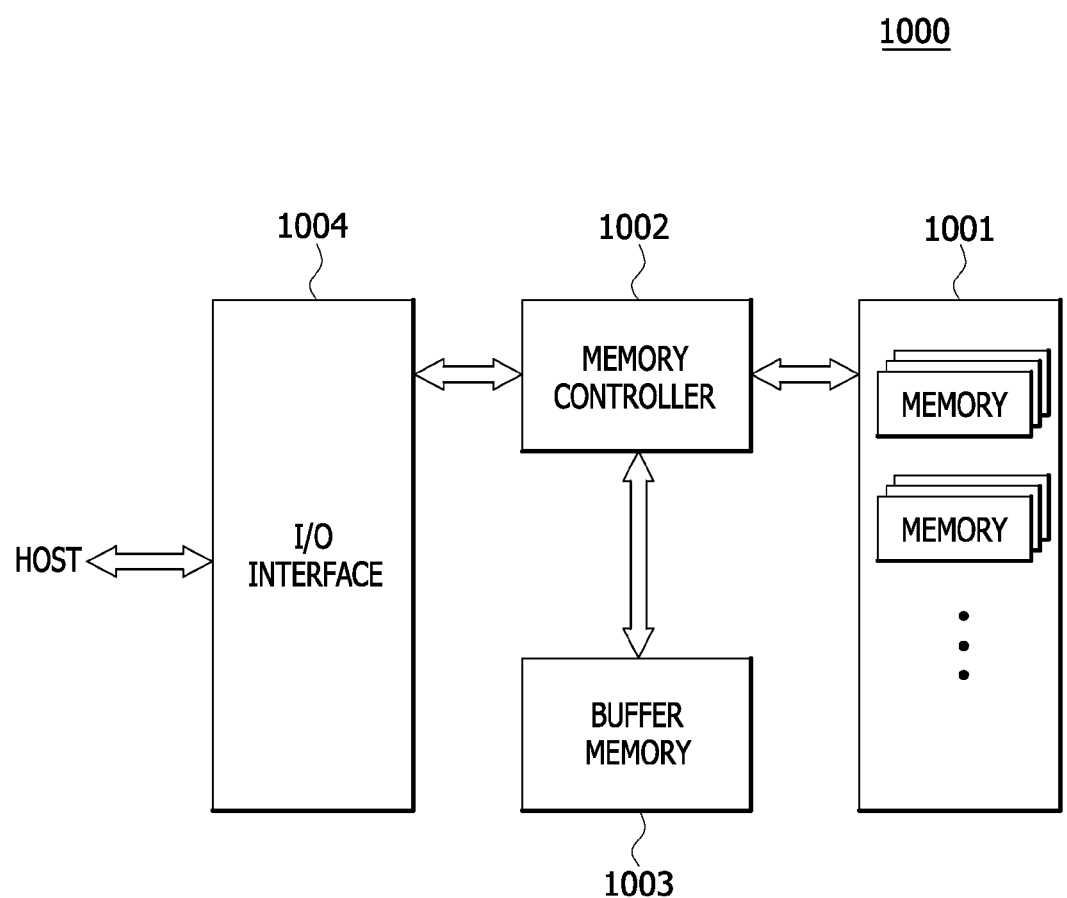
FIG. 10 is a block diagram illustrating a configuration of an electronic system employing the electronic device illustrated in FIG. 1.

The electronic devices described with reference to FIGS. 1 to 9 may be applied to an electronic system that includes a memory system, a graphic system, a computing system, a mobile system, or the like. For example, as illustrated in FIG. 10, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the electronic devices illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device)

through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 10 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 11:
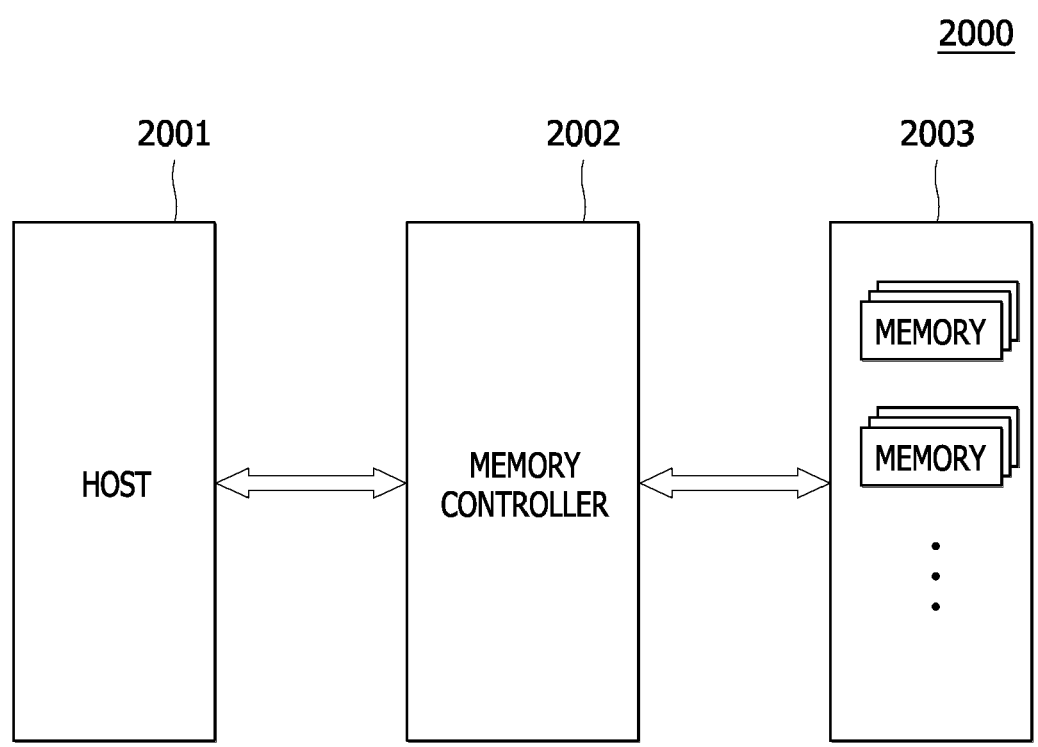
FIG. 11 is a block diagram illustrating a configuration of an electronic system employing the electronic device illustrated in FIG. 1.

Referring to FIG. 11, an electronic system 2000 according to an embodiment may include a host 2001, a memory controller 2002 and a data storage circuit 2003.

The host 2001 may output a request signal and data to the memory controller 2002 to access to the data storage circuit 2003. The memory controller 2002 may supply the data, a data strobe signal, a command, an address and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects errors of the data using an error correction code (ECC) circuit.

The memory controller 2002 may act as an interface that connects the host 2001 to the data storage circuit 2003 for communication between the host 2001 and the data storage circuit 2003. The memory controller 2002 may receive the request signal and the data from the host 2001 and may generate and supply the data, the data strobe signal, the command, the address and the clock signal to the data storage circuit 2003 in order to control operations of the data storage circuit 2003. In addition, the memory controller 2002 may supply the data outputted from the data storage circuit 2003 to the host 2001.

The data storage circuit 2003 may include a plurality of memories. The data storage circuit 2003 may receive the data, the data strobe signal, the command, the address and the clock signal from the memory controller 2002 to execute the write operation or the read operation. Each of the memories included in the data storage circuit 2003 may include a circuit that corrects the errors of the data using an error correction code (ECC) circuit. The data storage circuit 2003 may include the electronic devices illustrated in FIG. 1.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a single chip according to the embodiments. The memory controller 2002 and the data storage circuit 2003 may be realized in a single chip according to the embodiments.

What is claimed is:

1. An electronic device comprising:
   an error occurrence control circuit configured to generate an error insertion code that is counted whenever data is outputted during a read operation;
   a data conversion circuit configured to convert the data to generate internal data, in response to the error insertion code;
   a parity conversion circuit configured to convert a parity to generate an internal parity, in response to the error insertion code; and
   a verification signal generation circuit configured to generate a verification signal from a syndrome signal and the error insertion code,
   wherein the syndrome signal is generated from the internal data and the internal parity.

2. The electronic device of claim 1, wherein the error insertion code is counted whenever a count pulse is created in response to a read signal and a column pulse.

3. The electronic device of claim 2,
   wherein the read signal is enabled to perform the read operation; and
   wherein the column pulse is created whenever the data is outputted.

4. The electronic device of claim 1, wherein each of logic level combinations of the error insertion code corresponds to at least one bit included in the data and the parity according to an error check matrix.

5. The electronic device of claim 1, wherein the data conversion circuit inverts a logic level of at least one bit included in the data according to a logic level combination of the error insertion code to generate the internal data.

6. The electronic device of claim 1, wherein the parity is generated by a logical operation of logic levels of at least two bits selected from bits included in the data based on an error check matrix.

7. The electronic device of claim 1, wherein the parity conversion circuit inverts a logic level of at least one bit included in the parity according to a logic level combination of the error insertion code to generate the internal parity.

8. The electronic device of claim 1, wherein each of logic levels of bits included in the syndrome signal is determined by a logical operation of at least two bits selected from bits included in the internal data and any one bit selected from bits included in the internal parity, based on an error check matrix.

9. The electronic device of claim 1, wherein the syndrome signal includes information on a location of any one bit included in the internal data, which is generated by inversion of any one bit included in the data or a location of any one bit included in the internal parity, which is generated by inversion of any one bit included in the parity.

10. The electronic device of claim 1,
wherein the verification signal generation circuit generates the verification signal having a first logic level if the syndrome signal and the error insertion code are identical to each other; and
wherein the verification signal generation circuit generates the verification signal having a second logic level if the syndrome signal and the error insertion code are different from each other.

11. An electronic device comprising:
a parity generation circuit configured to perform a logical operation of logic levels of at least two bits selected from bits included in data to generate a parity, in response to an error check matrix;
a data conversion circuit configured to convert the data to generate internal data, in response to an error insertion code;
a parity conversion circuit configured to convert the parity to generate an internal parity, in response to the error insertion code; and
a verification signal generation circuit configured to generate a verification signal from a syndrome signal and the error insertion code,
wherein the syndrome signal is generated from the internal data and the internal parity.

12. The electronic device of claim 11,
wherein the error insertion code is counted whenever a count pulse is created in response to a read signal and a column pulse;
wherein the read signal is enabled to perform a read operation; and
wherein the column pulse is created whenever the data is outputted.

13. The electronic device of claim 11, wherein each of logic level combinations of the error insertion code corresponds to at least one bit included in the data and the parity according to an error check matrix.

14. The electronic device of claim 11, wherein the data conversion circuit inverts a logic level of at least one bit included in the data according to a logic level combination of the error insertion code to generate the internal data.

15. The electronic device of claim 11, wherein the parity conversion circuit inverts a logic level of at least one bit included in the parity according to a logic level combination of the error insertion code to generate the internal parity.

16. The electronic device of claim 11,
wherein each of logic levels of bits included in the syndrome signal is determined by a logical operation of at least two bits selected from bits included in the internal data and any one bit selected from bits included in the internal parity, based on the error check matrix; and
wherein the syndrome signal includes information on a location of any one bit included in the internal data, which is generated by inversion of any one bit included in the data or a location of any one bit included in the internal parity, which is generated by inversion of any one bit included in the parity.

17. The electronic device of claim 11,
wherein the verification signal generation circuit generates the verification signal having a first logic level if the syndrome signal and the error insertion code are identical to each other; and
wherein the verification signal generation circuit generates the verification signal having a second logic level if the syndrome signal and the error insertion code are different from each other.

18. An electronic device comprising:
an error occurrence control circuit configured to generate an error insertion code having a logic level combination corresponding to at least one bit included in data and a parity according to an error check matrix;
a data conversion circuit configured to invert a logic level of at least one bit included in the data to generate internal data, according to a logic level combination of the error insertion code;
a parity conversion circuit configured to invert a logic level of at least one bit included in the parity to generate an internal parity, according to a logic level combination of the error insertion code; and
a verification signal generation circuit configured to generate a verification signal from a syndrome signal and the error insertion code,
wherein the syndrome signal is generated from the internal data and the internal parity.

19. The electronic device of claim 18,
wherein the error insertion code is counted whenever a count pulse is created in response to a read signal and a column pulse;
wherein the read signal is enabled to perform a read operation; and
wherein the column pulse is created whenever the data are outputted.

20. The electronic device of claim 18,
wherein each of logic levels of bits included in the syndrome signal is determined by a logical operation of at least two bits selected from bits included in the internal data and any one bit selected from bits included in the internal parity, based on the error check matrix; and
wherein the syndrome signal includes information on a location of any one bit included in the internal data, which is generated by inversion of any one bit included in the data or a location of any one bit included in the internal parity, which is generated by inversion of any one bit included in the parity.

21. The electronic device of claim 18,
wherein the verification signal generation circuit generates the verification signal having a first logic level if the syndrome signal and the error insertion code are identical to each other; and
wherein the verification signal generation circuit generates the verification signal having a second logic level if the syndrome signal and the error insertion code are different from each other.

22. An electronic device comprising:
a data conversion circuit configured to insert an erroneous bit into data corresponding to a bit location using an error insertion code and generate internal data;

a parity conversion circuit configured to insert an erroneous bit into a parity of the data corresponding to a bit location using the error insertion code and generate internal parity; and a verification signal generation circuit configured to verify whether an error correction operation for the internal data and the internal parity has performed correctly by detecting whether the erroneous bits have been generated at the desired locations, and configured to generate a verification signal from a syndrome signal and the error insertion code, wherein the syndrome signal is generated from the internal data and the internal parity.

23. The electronic device of claim 22, wherein using the error insertion code to insert the errors into the data and the parity to generate the internal data and the internal parity is performed according to a logic level combination of the error insertion code.

24. The electronic device of claim 22, further comprising:

a syndrome generation circuit configured to perform a logical operation and an error correction operation, using a hamming code, on the internal data and the internal parity to generate a syndrome signal, and wherein the verification signal generation circuit verifies whether the error correction operation for the internal data and the internal parity has performed correctly by comparing the syndrome signal with the error insertion code.

* * * * *